April 16, 1968 A. H. BRUINSMA ETAL 3,378,699

ELECTRICAL CONTROL CIRCUITS

Filed Jan. 22, 1965

INVENTORS
ANNE H. BRUINSMA
JOHANNES MEYER CLUWEN
BY
[signature]
AGENT

United States Patent Office 3,378,699
Patented Apr. 16, 1968

3,378,699
ELECTRICAL CONTROL CIRCUITS

Anne Hendrik Bruinsma and Johannes Meyer Cluwen, Emmasingel, Eindhoven, Netherlands, assignors to North American Philips Company, Inc., New York, N.Y., a corporation of Delaware Filed Jan. 22, 1965, Ser. No. 427,234
Claims priority, application Netherlands, Feb. 11, 1964, 64—1,113
5 Claims. (Cl. 307—241)

This invention pertains to electrical control circuits and in particular to such circuits wherein the current through a load changes in direction in order to control the load. As an example, the load may be a motor.

Such circuits, using transistors as control elements, are broadly known. For example, one such circuit arrangement comprises two transistors of the same conductivity type with the emitter-collector paths of the transistors connected to a supply source in series with a diode connected between the collector of the first transistor and the emitter of the second; the load is connected to the junction between the diode and the emitter of the second transistor. In this arrangement, the transistors should have a low quiescent current, i.e., the current flowing through the transistors when no control signal is applied to the input of the transistor. Various means have been proposed for restricting the quiescent current and these all involve the use of an additional voltage source. In practice this source must be capable of providing a comparatively high voltage in order to be effective and this involves an undesirable dissipation of energy; in addition, the transistors used must be capable of withstanding the high voltages of the additional source.

It is a primary object of the invention to provide a reliably operating control circuit of the above type wherein the quiescent current of the transistors is low and the use of an additional voltage source is not required.

According to a principal aspect of the invention, the collector circuit of the first transistor and the base circuit of the second transistor both have a common current-limiting element coupled thereto. The value of the current at which limiting starts is preferably chosen to be approximately equal to the current passing through the load at maximum drive, divided by the collector-base current amplification factor of the second transistor. As used herein, the term current-limiting element is understood to mean an element having a non-linear current-voltage characteristic curve wherein there is a large and abrupt increase in voltage when the current tends to exceed a given value.

Further objects and features of the invention will be apparent from the following description thereof, taken in conjunction with the accompanying drawing, wherein.

Figures 1, 2:
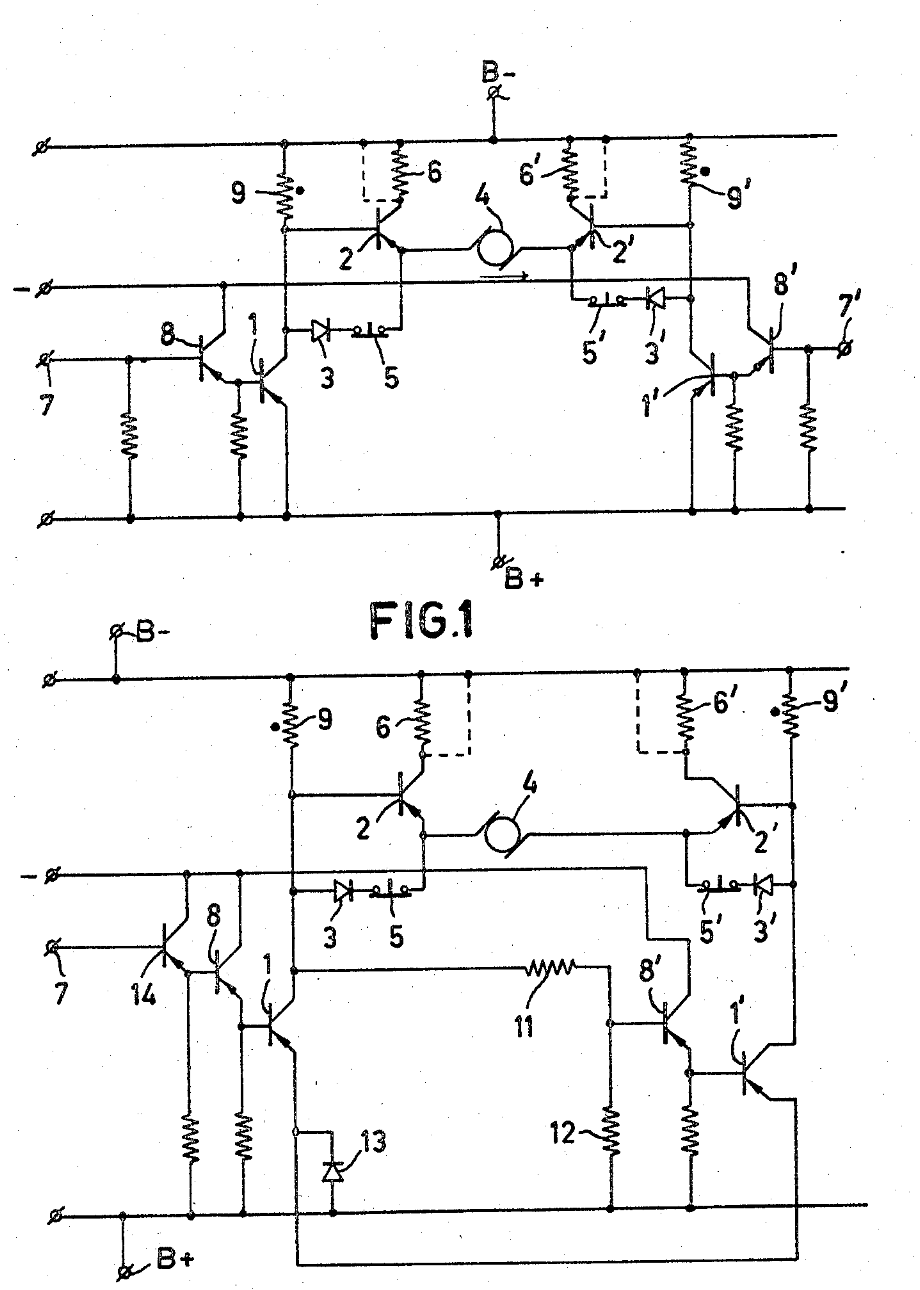
FIG. 1 is a schematic circuit diagram of a first embodiment.
FIG. 2 shows a second embodiment of the invention.

The embodiment shown in FIG. 1 comprises a first transistor 1 and a second transistor 2 of the same conductivity type (in FIG. 1 both transistors are of the p-n-p type). The emitter-collector paths of the transistors 1 and 2 are connected, in series with a diode 3 connected between the collector of the first transistor and the emitter of the second transistor, to the terminals B+ and B— respectively of a supply source. A load 4, for example an electric motor, is connected with one terminal to the junction between the diode 3 and the emitter of the second transistor 2. The other terminal of the load 4 may be connected to a point of fixed voltage, the value of which lies between the voltages prevailing at the terminals B+ and B—. In the embodiment shown there is employed a second set of similarly connected transistors 1′, 2′ and a similar diode 3′. The switches 5 and 5′ serve as limit switches for disabling the device, when the rotor has reached a given position. The resistors 6 and 6′ connected in the collector circuits of the transistors 2 and 2′, respectively, may be provided for avoiding overload of the respective transistors 2 and 2′. Emitter followers 8 and 8′ are provided at the inputs to transistors 1 and 1′ respectively, and input terminals 7 and 7′ are coupled to the base inputs of emitter followers 8 and 8′. When a control voltage is applied between the input terminals 7 and 7′, polarizing the base-electrode of transistor 8 negative with respect to that of transistor 8′, the current flowing through the transistor 1 increases and the current flowing through the transistor 1′ decreases.

When this occurs, there will be an increase in the voltage drop across the resistor 9 connected both to the collector of the transistor 1 and the base of the transistor 2; this increase will tend to render the transistor 2 less conducting. Similarly, the voltage drop across the corresponding resistor 9′ will decrease, and the transistor 2′ will thereby tend to become more highly conductive. In response to these conditions, a current having the direction of the arrow will flow through the load 4. If, however, the control-voltages between the terminals 7 and 7′ are such that the current through the transistor 1 is decreasing when the current through transistor 1′ is increasing, the current passing through the load 4 will reverse its direction and flow opposite to that indicated by the arrow. A similar effect is obtained when, for example, a step function control-voltage is applied alternatively between the terminal 7 and ground or between the terminal 7′ and ground respectively; in this case, either the transistors 8 and 1 or the transistors 8′ and 1′ are rendered conducting. The circuit elements are chosen such that no current flows through the load 4 in the absence of a control voltage between the terminals 7 and 7′. Due to the presence of the diodes 3 and 3′, the transistors 2 and 2′ are then nonconducting. On the other hand a small decrease of the current through the transistor 1 (or 1′), as compared with this rest position, brings about cutoff of the diode 3 (or 3′), so that the transistor 2 (or 2′) becomes conducting.

It has been found that it is necessary that the resistor 9 have a low value in order that a high maximum current through the load 4 be attained. However, this involves a comparatively high quiescent-current adjustment. In general, the quiescent-current consumption might be completely eliminated by using transistors of opposite conductivity types, but it is found that transistors of opposite conductiviety types capable of dissipating high currents are not readily available. As stated above, in the prior art it has been proposed to reduce the disadvantage of an excessively high-quiescent-current consumption by connecting the resistor 9 (or 9′) to a higher (negative) voltage than the collector of the transistor 2 (or 2′). However, this has the disadvantage that more energy is dissipated; in addition, the transistor 1 (or 1′) must be capable of withstanding this higher voltage.

In accordance with the invention, the quiescent-current is considerably reduced when the resistor 9 (or 9′) is constituted by a current-limiting element. Such current-limiting elements are known per se. As an example there may be mentioned ceramic resistors having a high positive temperature coefficient, for example those including barium titanate, the dynamic resistance value of which may increase by several decades at a temperature increase of 10°; (the statically measured current-voltage characteristic curve may even have a negative resistance portion). Other examples are: semiconductor diodes driven in the reverse direction, which diodes pass a substantially constant current under the action of incident radiation; and field-effect transistors, the gate electrodes of which are connected to the source electrodes or to a voltage narrowing the current channel of the field effect transistor.

The current value of the current-limiting element 9 (or 9') at which limitation starts, is preferably approximately equal to the current passing through the load at maximum drive, divided by the collector-base current amplification factor of the second transistor 2 (or 2'). With this maximum drive the transistor 1, for example, is cut off, whereas the transistor 1' is completely conducting. In order to obtain the maximum current through the load 4 the transistor 2 must be conducting at a maximum, whereas the transistor 2' must be cut off. The voltage drop across the transistors 1' and 2 is then negligible with respect to the voltage drop across the load 4 (also the diode 3' must have a minimum voltage-drop in the forward direction), while the current through the transistors 1 and 2' is then negligible. In this maximum-current state it is advantageous for the effective resistance of the element 9 to have a minimum value, so that the base current of the transistor 2, in spite of the small voltage drop across the element 9, is sufficient to allow the transistor 2 to pass the maximum current.

When, starting from the above-mentioned maximum-current state, the current through the transistor 1 is increased and that passing through the transistor 1' is decreased, the increase in current will soon result in a very great increase (as the case may be even to a negative value) of the effective resistance of the element 9'. Since the element 9 will counteract any increase of the flowing through it, said increase in current through the transistor 1 will result in a corresponding decrease of the base current of the transistor 2. In a similar manner the decrease of the current through the transistor 1 will result in a corresponding increase of the base current of the transistor 2'. The rest position is reached when current no longer flows through the load 4, and hence when the same potential prevails at the emitters of the transistors 2 and 2'. In order to attain said potential, the transistor 1 must convey a comparatively high current through a comparatively small resistor 9 in order to produce an adequate voltage drop across it. Providing a current-limiting resistor according to the invention, will suffice since, owing to the increasing effective resistance of the element 9, the voltage-drop across it increases extremely rapidly.

FIG. 2 is a schematic circuit diagram of another embodiment of the invention. Like reference numerals in both figures denote like elements. FIG. 2 includes, in addition to the elements of FIG. 1, a voltage divider 11, 12 connected from the collector of transistor 1 to the B+ terminal. Instead of a separate input terminal 7' shown in FIG. 1, the drive for the transistor 8' of FIG. 2 is taken from the collector voltage of transistor 1 through the voltage divider 11, 12. In addition, the circuit of FIG. 2 includes a diode 13 connected as shown in the common emitter conductor of transistors 1 and 1' to the B+ supply; the diode 13 provides a low threshold voltage in the emitter circuits of the transistors 1 and 1'. The circuit of FIG. 2 also includes an additional emitter follower 14 preceding the transistor 8.

As shown in both embodiments, an auxiliary voltage source is used for providing the operating voltages for the transistors 8 and 8' in FIG. 1 and the transistors 8, 8' and 14 in FIG. 2. The connection to this voltage source is labeled as (—) in the figures. The auxiliary voltage source is chosen to have a lower voltage and current rating than the supply source connected to the terminals B+ and B—, thus avoiding undue dissipation of energy without detriment to circuit operation.

While the invention has been described with respect to specific embodiments, modifications and variations thereof will readily occur to those skilled in the art without departing from the inventive concept, the scope of which is set forth in the appended claims.

What we claim is:

1. An electrical control device for reversing the direction of current through a load, comprising: a first transistor and a second transistor of the same conductivity type, circuit means for connecting the emitter-collector paths of both transistors in series with a source of supply voltage and with a diode connected between the collector of the first transistor and the emitter of the second transistor, means for applying a control signal to the base of the first transistor, a load connected to the junction between said diode and the emitter of the second transistor, and a common current-limiting element having a non-linear current-voltage characteristic curve coupled to the collector circuit of the first transistor and the base circuit of the second transistor.

2. A device as claimed in claim 1, wherein said current-limiting element comprises a resistor having a high positive temperature coefficient.

3. An electrical control device for reversing the direction of current through a load, comprising: a first transistor and a second transistor of the same conductivity type, circuit means for connecting the emitter-collector paths of both transistors in series with a source of supply voltage and with a diode connected between the collector of the first transistor and the emitter of the second transistor, means for applying a control signal to the base of the first transistor, a load connected to the junction between said diode and the emitter of the second transistor, and a common current-limiting element having a non-linear current-voltage characteristic curve coupled to the collector circuit of the first transistor and the base circuit of the second transistor, said element being adapted to start current limitation at a value equal to the current passing through the load at maximum excitation, divided by the collector-base current amplification factor of said second transistor.

4. A device as claimed in claim 3, wherein said current-limiting element comprises a resistor having a high positive temperature coefficient.

5. An electrical control device for reversing the current through a load, comprising: first, second, third and fourth transistors, circuit means for connecting the emitter-collector paths of the first and second transistors in series with a source of supply voltage and with a diode connected between the collector of the first transistor and the emitter of the second transistor, circuit means for connecting the emitter-collector paths of the third and fourth transistors in series with a source of supply voltage and with a diode connected between the collector of the third transistor and the emitter of the fourth transistor, means for applying control signals to the bases of said first and third transistors, a load connected to the junction between said diode and the emitter of the second transistor, a first common current-limiting element having a non-linear current-voltage characteristic curve coupled to the collector circuit of the first transistor and the base circuit of the second transistor, and a second common current-limiting element having a non-linear current-voltage characteristic curve coupled to the collector circuit of the third transistor and the base circuit of the fourth transistor.

References Cited

UNITED STATES PATENTS

| | | | |
|---|---|---|---|
| 3,174,058 | 3/1965 | Xylander | 307—88.5 |
| 3,260,912 | 7/1966 | Gregory | 318—345 X |

FOREIGN PATENTS 762,867 12/1956 England.

OTHER REFERENCES

Chin: "Sample Pulse Driver," I.B.M. Technical Disclosure Bulletin, vol. 6, No. 4, September 1963 (p. 102 relied on).

ARTHUR GAUSS, *Primary Examiner.*

DONALD D. FORRER, *Examiner.*